| United States Patent [19] | [11] | 4,301,040 |
|---|---|---|
| Berbeco | [45] | Nov. 17, 1981 |

[54] ELECTRICALLY CONDUCTIVE FOAM AND METHOD OF PREPARATION AND USE

[75] Inventor: George R. Berbeco, West Newton, Mass.

[73] Assignee: Charleswater Products, Inc., Needham, Mass.

[21] Appl. No.: 161,138

[22] Filed: Jun. 19, 1980

Related U.S. Application Data

[63] Continuation-in-part of Ser. No. 918,411, Jun. 23, 1978, Pat. No. 4,231,901, which is a continuation-in-part of Ser. No. 824,051, Aug. 12, 1977, Pat. No. 4,150,418.

[51] Int. Cl.³ ............................................. H01B 1/06
[52] U.S. Cl. ................................... 252/511; 252/500; 260/DIG. 15; 260/DIG. 16; 260/DIG. 21; 361/212; 428/311; 428/315; 521/55
[58] Field of Search ............... 252/500, 511; 428/311, 428/315; 361/212; 206/331, 328, 334, 523; 260/DIG. 15, DIG. 16, DIG. 19, DIG. 17, DIG. 21; 521/55, 137

[56] References Cited

U.S. PATENT DOCUMENTS 3,459,924  8/1969  McMichael .......................... 252/511
4,150,418  4/1979  Berbeco ........................... 361/224 X
4,158,031  6/1979  Reuter et al. .................. 252/511 X

FOREIGN PATENT DOCUMENTS 51-6363  7/1976  Japan ..................................... 521/55

OTHER PUBLICATIONS

Chemical Abstracts 82(1975), 44/99a "Properties of Carbon Black Filled Polyurethanes Latex Films," Kurbznova, I. I. et al.
IBM Technical Disclosure Bulletin, vol. 17, No. 10 (Mar. 1975) "Protective Containers for Integrated Circuit Modules".

Primary Examiner—J. L. Barr
Attorney, Agent, or Firm—Richard P. Crowley

[57] ABSTRACT

A static-free, polymeric surface mat to prevent the accumulation of static charge, particularly in the packaging and handling of electronic components and devices, which mat comprises a nonconductive, synthetic-material layer with a top surface, optionally an adhesive layer on the bottom surface of the synthetic material, and a solid or foam layer of a conductive material, such as an open-cell urethane foam impregnated with finely-divided conductive particles, and a film-forming binder material to secure the particles uniformly onto the foam.

13 Claims, No Drawings

ELECTRICALLY CONDUCTIVE FOAM AND METHOD OF PREPARATION AND USE

REFERENCE TO PRIOR APPLICATION

This application is a continuation-in-part of my co-pending U.S. patent application Ser. No. 918,411, filed June 23, 1978 (now U.S. Pat. No. 4,231,901, issued Nov. 4, 1980), hereby incorporated by reference, which application is a continuation-in-part of U.S. patent application Ser. No. 824,051, filed Aug. 12, 1977 (now U.S. Pat. No. 4,150,418, issued Apr. 17, 1979).

BACKGROUND OF THE INVENTION

Synthetic film and sheet materials of a conductive nature (approximately 30,000 ohms per square surface resistivity or less; for example, 5,000 ohms) are desirable for use in environments where electronic components, discrete devices, electronic equipment, microprocessors, minicomputers, intelligent terminals, and any electronic equipment containing static-sensitive components may be subject to a static charge. Such charge may be generated by people or the environment, such as shipping, transporting, or otherwise moving such electronic components from place to place, utilizing the keyboard on a terminal, both in manufacture of electronic devices and equipment and in transporting such devices and equipment, and in other utilization of such electronic devices and equipment. In electronic-manufacturing operations, production personnel utilize inexpensive synthetic materials for floor and work-surface coverings, as well as wearing apparel, such material being subject to rapid static-charge buildup and maintenance. Also, in word-processing and data-processing areas, synthetic materials are used in floor coverings, as well as wearing apparel. In shipping electronic components and devices, the shipping-room and receiving-room personnel may generate static charges in normal course of business, which may be imparted, in handling, to electronic components or devices.

In these environments, conductive sheet materials are utilized and provide a rapid circuit to ground for any static electrical charges that have been built up, both on table and counter areas and in floor materials. Conductive bags, made of polyethylene, and conductive foam, made of polyurethane, as described in my parent co-pending application, have been used to alleviate the static electrical problem. Also, conductive polyethylene floor and table mats are utilized, as well as stainless steel for table materials.

It is, therefore, desirable to provide conductive surface coverings, such as table and floor mats, and particularly to provide an improved, economical, easily manufactured, clean conductive floor and table covering for use in electronic manufacturing facilities, shipping areas, and in data-processing, computer and word-processing areas.

SUMMARY OF THE INVENTION

My invention relates to an improved, static-free, surface-covering material, such as a polymeric surface material, suitable for use for table-top and floor use, and a method of manufacturing such materials. In particular, my invention is directed toward static-free table tops and floor mats having antistatic properties, to prevent the accumulation of static charge thereon.

My invention relates to a static-dissipating, synthetic, surface-covering sheet material, such as table-top and floor materials, which material comprises a generally flat, electrically nonconductive, synthetic sheet material, for example, having a washable top surface suitable for use as a surface covering, either for a floor or for table tops, and a thin, electrically conductive layer of a polymeric film-forming particulate binder material secured to the bottom surface of the synthetic sheet material, with the polymeric material containing therein a uniformly dispersed amount of an electrically conductive particulate material. The invention provides for an article of manufacture and a method of manufacturing the article of varying degrees of softness, resilience, color and cleanliness, particularly for in-use applications, where it is desired to prevent the accumulation of static charges, such as in packaging and handling of electronic components and devices, and where data-processing, computer-memory and microcomputer equipment are used.

The article of manufacture comprises a synthetic, top, nonconductive surface which would be suitable for use as a work table or washable top surface in a work environment. The synthetic material selected should be capable of forming a clean tabletop surface designed particularly for the electronic and data-processing industries in which personnel are subject to static-charge accumulation, and where equipment, which generates static charges, is present in the work environment. The synthetic material may be provided in a variety of colors and ranges of thicknesses up to, for example, 0.30 inches in thickness; although thickness of 0.12 inches or less is more desirable; for example, from about 0.05 to 0.10 inches. The synthetic top covering may be smooth, matted or embossed, if desired, and may comprise a woven, synthetic material, such as a fabric, or a nonwoven synthetic material, such as a polyester or nylon or other synthetic materials.

The synthetic material, which forms the top nonconductive surface, may be composed of a wide variety of polymers, to include, but not limited to: natural rubber; styrene-butadiene rubber; vinyl-chloride resin; nylon; polycarbonate; polyethylene; and polypropylene. Where the article of manufacture is to be employed, for example, as a floor mat, the synthetic material typically should be soft, flexible or elastomeric in nature and be suitable for use as a floor mat, while, where the material is employed as a work surface, a hard, smooth-surface, synthetic material is more desirable.

The particularly preferred synthetic material for hard surfaces comprises a thermosetting, polymeric laminate material. Such laminate material comprises a resin-impregnated transparent or printed sheet, to form, either alone or with a plurality of underlying, resin-impregnated sheets, a nonconductive, semirigid material having a hard, smooth, formica-type top surface. The preferred synthetic material would include a top layer composed of a hard thermoset resin, such as a melamine-formaldehyde, urea-formaldehyde, phenol-formaldehyde or other thermosetting-type hard resin, covering a transparent or printed, thin, paper sheet material which has been impregnated with the resin or laminated to an underlying carrier sheet. Such formica sheets are typically very nonconductive and are suitable for use as top surface sheets, where a clean room or washable surface is required. Such hardcovering surface material is typically commercially provided and sold as a laminate-type material having a hard, transparent thermosetting resin on the washable, smooth top surface, which resin is impregnated into a series of porous paper sheets laminated together under heat and pressure, so that the bottom surface typically represents a rough back surface, such as a kraft paper which may or may not be impregnated with the resin, and which bottom surface may be secured by adhesives and lamination to the other sheets, such as a particle board, to make up the laminate for a counter-top surface.

The layer of conductive material either may be a solid or a foam and may be applied directly to the bottom surface of the synthetic sheet material, or typically, with hard laminate sheet material, such as resin-impregnated, laminate formica sheets, an intervening layer of adhesive is employed to secure the nonconductive layer to the bottom surface of the laminate sheet.

The conductive layer, which may be a solid layer or a foam layer, includes a polymeric-binding agent to bind together an antistatic amount of conductive particulate material, such as carbon-black particles. Where a foam layer is used, the foam comprises an open-cell impregnable foam, such as polyurethane, which is impregnated with an elastomeric-type binder containing in part a film-forming polymer, and also contains an antistatic or electrically conductive amount of finely-divided, particulate, carbon-black particles dispersed about and generally uniformly throughout the impregnated urethane foam.

The conductive material employed may vary and includes, but is not limited to, the finely-divided metal particles, such as silver, aluminum and metal salts, such as aluminum silicate; although carbon-black particles are the most preferred conductive material. The conductive particles may include very finely-divided metal particles, alumina-silicate particles, such as synthetic or molecular sieves containing water, or carbon-black particles or other carbon particles or graphite fibers, alone or in combination. The amount of particular material should be sufficient to obtain the desired amount of antistatic or electrically conductive properties, such as less than about 30,000 ohms/square inch; for example, 10,000 or 5,000 ohms/square inch of surface resistance. Typically the amount ranges from about 2% to 40% by weight of the conductive layer, particularly 6% to 30%. The particle size of the particles to be employed may vary, but, in the preferred embodiment, finely-divided carbon-black particles, such as carbon black having a particle size of less than 40 millimicrons, and typically from 25 to 35 millimicrons, and a nitrogen surface area ranging from 100 to 1200 square meters per gram.

Where a foam layer is used, the amount of particulate material employed should be insufficient to render inflexible the foam, except as specific applications may demand. The conductive material should be secured adequately to the impregnated foam with a binding agent, such that it cannot be rubbed off on contact or during use. The conductive material, such as carbon black, may be used alone or in combination with other conductive materials and additives. The foam useful in my invention may be composed of a variety of materials, but more particularly is composed of open-cell; for example, over 90% open-cell, impregnable foam, such as polyurethane, either polyether or polyester foam. The foam may be available in low-density and high-density forms, with such foam being either pigmented or unpigmented and varying in density from 0.5 lbs per cubic foot to 10 lbs per cubic foot; for example, 2.5 lbs to 6 lbs per cubic foot.

Ohter foams would include open-cell, vinyl-chloride foams; polyolefin foams, such as polyethylene and polypropylene; polystyrene foams; silicone foams; phenolic foams; epoxy foams; polycarbonate foams and other foam materials. The foam should be open-cell in nature, so that the foam may be impregnated adequately, rapidly and uniformly with the particulate conductive material after or during the foam formation into the particular form, density and shape of use. The foam may vary in hardness from soft to rigid.

The binding agent may comprise an elastomeric/polymeric material, such as butadiene-styrene resin, or similar film-forming elastomeric materials, such that the carbon-black or other particles, which impart the conductive properties, may be bound to the impregnated foam material, or to the film-forming polymer, to form a solid layer. Typical polymeric binders to be employed are those binders which are now employed in the manufacture of saturated paper sheets, and which include, but are not limited to: polymeric binders, particularly an emulsion form of diene-styrene elastomers, such as butadiene-styrene; acrylonitrile-styrene; copolymers and copolymers with acrylics; acrylic resins, vinyl polymers, such as vinyl halides like homopolymers or polyvinyl chloride or copolymers of the vinyl chloride with vinyl acetate and other vinyl esters and ethers; urethane emulsions and the like, wherein a part of the binding system comprises a film-forming polymer. Where the polymeric binder is a styrene-butadiene elastomer, I have found that the styrene content of the impregnated foam should be 60% by total weight or more; for example, 60% to 80%, to provide suitable lead retention.

The polymer-binding agent often ranges from about 1% to 60% by weight of the finished foam material; for example, 25% to 50%. The polymer, with latex employed as the binding agent, and the particulate material, to form the solid layer or to impregnate the foam, may include other ingredients and additives as desired, such as pigments, dyes, antioxidants, stabilizers, fillers, catalysts, antistatic agents, flame retardants, plasticizers, surfactants, release agents and other additives.

The conductive foam layer comprises an elastomeric/polymeric-binding material, which includes a film-forming polymer, which is impregnated with particulate conductive particles, such as carbon black. The foam is prepared and then secured by an adhesive layer to the back surface of the synthetic sheet material, such as a floor mat. A flexible nonconductive layer is used particularly as the bottom surface of flexible, elastomeric-type floor mats, while the solid conductive layer is used as a back surface layer with hard, synthetic laminate material used for work surfaces.

The conductive particles may be incorporated or impregnated into the foam material. For example, one way is by dispersing the conductive particles in solution or emulsion of the polymer-binding agent and then saturating the foam with the solution and, thereafter, drying the foam. Also the conductive particles may be added or dispersed in the urethane prior to foam formation or after and prior to adding the polymer-binding agent to the foam.

In another method, the conductive particles may be dispersed, such as by use of surfactants, particularly anionic dispersing agents, rosin acid or fatty acids with a pH of 8.5 to 11.5, in an aqueous composition and applied onto the ready-formed foam, so as to penetrate the foam material, either from one or both sides, directly at the formation of the foam, followed by impregnating the foam with a polymer-binding agent. Various other techniques, such as dusting of the conductive particles onto the surface of the foam and subsequently calendering of the foam to impregnate the particles therein, may be employed to impregnate the particles generally uniformly throughout the foam. The conductive particles also may be dispersed separately and then added to the polymeric binder; for example, carbon black may be dispersed in water with a dispersing agent, such as surfactants, and then the dispersant may be mixed with a polymeric emulsion. The foam material is then impregnated with this mixture.

The thickness of the conductive layer may vary as desired. For example, where a foam conductive layer is employed, particularly on the back surface of a floor material, such as rubber or plastic matting material, then the flexible foam has a dual function of preventing the accumulation of static charge and also may serve to provide a soft, flexible cushion, and thus may range from 0.05 to 0.5 inches; for example, 0.1 to 0.25 inches. Where a solid conductive layer is employed; that is, where the film-forming polymeric binder and the particulate material are employed together as the conductive layer, the layer applied or coated to the back surface of the synthetic sheet material may vary, for example, from 2 to 300 mils; for example, 5 to 100 mils. The amount of particulate material employed and the thickness of the layer should be selected to provide for desired static-free conditions. The conductive layer should be sufficient to provide for an electrically conductive path to static charges of up to about 5,000 or 1,000 volts, and to provide a rapid path to the ground for such static electricity.

For the purpose of illustration only, my invention will be described in connection with certain embodiments; however, it is recognized that various changes, additions and modifications may be made by those persons skilled in the art, all within the spirit and scope of my invention.

DESCRIPTION OF THE EMBODIMENTS

Example 1

A dispersion of carbon black was prepared by adding the following to a Waring Blender:

16.2 grams of an extra-conductive, oil-furnace carbon black
1.9 grams of an anionic polymer-type dispersing agent
0.1 grams NAOH
81.8 grams $H_2O$.

The solution was dispersed at high speed for about 10 minutes. 44 grams of the above dispersion were added to 100 grams of GRS (styrene-butadiene latex, 17.6% solids, 35% styrene and 55% butadiene at pH=10.0). A ½-inch-thick piece of ether urethane foam (open-cell) was saturated with the solution and was run through a laboratory textile paddle (wringer). The resulting foam was air-dried, and a second piece was dried in an oven at 80° C. Both foam pieces had a resulting resistance of less than 5,000 ohm/$inch^2$, when measured with a 500,000-volt Volt Ohm Meter.

Example 2

An impregnating solution was prepared by the addition of 4 gallons of a styrene-butadiene latex comprising approximately 47% styrene and 53% butadiene copolymer with a rosin-acid emulsifier system, at 42% total solids and a pH of 11. This latex was added to 2 gallons of a 20% by weight carbon-black dispersion and was agitated in a wringer washing machine. About ½-inch-thickness, porous, urethane foam was immersed in the solution and was wrung through the wringer. The resulting foam, upon drying, was very soft and flexible and exhibited no loss of carbon black when rubbed manually. The electrical surface resistance was approximately 20,000 ohms/$inch^2$.

Example 3

A sheet of approximately 1/8th of an inch in thickness of a conductive polyurethane foam was prepared as in Example 1 or 2 and was secured to a sheet of 0.03 of an inch thick of styrene-butadiene rubber (SBR) sheeting through the use of a pressure-sensitive adhesive and pressure applied to the material to obtain a smooth surface. The resulting material is suitable for use as a static-free floor mat with charge to 5,000 volts, with the time measured for the charge to dissipate to zero volts. At 37% relative humidity, the time required was less than 0.06 seconds. Sheets of white, blue and yellow SBR and of nitrile rubber also were applied to conductive foam and charged up to 5,000 volts, resulting in a time to zero ground volts of less than 0.06 seconds in each test.

Example 4

A sheet of a melamine-formaldehyde laminate of approximately 1/16th of an inch was secured from a local supplier, the sheet material having a hard, washable surface and suitable for use as a kitchen table-top counter. The bottom of the laminate was coated with a conductive layer comprising a carbon-black coating composed of four parts of a 50% by weight dispersion of carbon black in water and six parts of a polystyrene-butadiene, film-forming binding agent, the material being prepared in the manner as set forth in Examples 1 and 2. The dispersion was applied as a thin coating layer on the bottom side of the laminate and was allowed to air-dry, and then the laminate was glued to a wood table-top surface, utilizing conventional adhesives used for melamine-formaldehyde adhesion. The resulting article was then charged on its surface to 5,000 volts and the time measured for the charge to dissipate to zero volts, and at 30% relative humidity, the time required was less than 0.05 seconds. The article was measured for surface resistivity and volume resistivity. The surface resistivity was measured to be $1 \times 10^9$ ohms per square centimeter, and the volume resistivity was $1 \times 10^7$ ohms centimeter.

What I claim is:

1. A static-dissipating, synthetic, surface-covering sheet material which comprises:
   (a) an electrically nonconducting, synthetic sheet laminate material having a hard thermoset resin top surface suitable for use as a surface covering; and
   (b) an electrically conductive layer of a polymeric, film-forming, particulate binder material secured to the bottom surface of the synthetic sheet material, the polymeric material containing uniformly dispersed therein a static-reducing amount of electrically conductive particulate material wherein the particulate material comprises from about 2 to 40% by weight of the polymeric binder material, whereby static charges, accumulating on the top surface of the synthetic sheet material, are dissipated through the electrically conductive layer.

2. The article of claim 1 which includes an adhesive layer to adhere the bottom surface of the synthetic sheet material to the electrically conductive layer.

3. The article of claim 1 wherein the electrically conductive layer comprises a thin solid coating of the polymeric binder material to the bottom surface of the synthetic sheet material.

4. The article of claim 1 wherein the electrically conductive layer comprises a polymeric foam layer uniformly impregnated with the electrically conductive particles, with the polymeric binder material securing the conductive particulate material to the polymeric foam.

5. The article of claim 4 wherein the polymeric foam comprises an open-cell, flexible, urethane foam material.

6. The article of claim 1 wherein the polymeric binder material comprises a styrene-butadiene polymer.

7. The article of claim 1 wherein the particulate material has a particle size of less than about 40 millimicrons and a nitrogen surface area of 100 to 1200 m$^2$/gram.

8. The article of claim 1 wherein the particulate material comprises carbon-black particles.

9. The article of claim 1 wherein the surface resistance of the electrically conductive layer is characterized by a surface resistance of less than 5,000 ohms per square inch.

10. The article of claim 1 wherein the synthetic sheet material comprises a flexible synthetic material selected from the group consisting of nitrile rubber, butyl rubber, SBR, polyolefin and vinyl-chloride resins.

11. The article of claim 1 wherein the resin is a melamine-formaldehyde resin surface.

12. A static-dissipating, synthetic, surface-covering sheet material which comprises:
(a) a flat, electrically nonconducting, synthetic sheet material having a washable top surface suitable for use as a surface covering;
(b) an adhesive layer securing the bottom surface of the synthetic sheet material to the electrically conductive layer; and
(c) a thin, electrically conductive layer of a polymeric, film-forming, particulate binder material, the conductive layer comprising an open-cell, polymeric urethane foam material, the polymeric foam layer uniformly impregnated with the electrically conductive particles, the binder material secured to the bottom surface of the synthetic sheet material by the adhesive layer, the polymeric material securing the conductive particles to the polymeric foam and containing uniformly dispersed therein a static-reducing amount of electrically conductive particulate material having a particle size of less than about 40 millimicrons and a nitrogen surface area of 100 to 1200 m$^2$/gram, the surface resistance of the electrically conductive layer characterized by a surface resistance of less than 5,000 ohms per square inch, whereby static charges, accumulating on the top surface of the synthetic sheet material, are dissipated through the electrically conductive layer.

13. A static-dissipating, synthetic, surface-covering sheet material which comprises:
(a) an electrically nonconducting, synthetic, sheet laminate material having a hard, smooth, thermoset-resin top surface and a top surface suitable for use as a surface covering;
(b) an adhesive layer securing the bottom surface of the synthetic sheet meterial to the electrically conductive layer; and
(c) a thin, electrically conductive, solid coating layer of a polymeric, film-forming, particulate binder material comprising a styrene-butadiene polymer, the polymeric binder material secured to the bottom surface of the synthetic sheet material by the adhesive layer, the polymeric material containing uniformly dispersed therein a static-reducing amount of electrically conductive particulate material comprising carbon-black particles having a particle size of less than about 40 millimicrons and a nitrogen surface area of 100 to 1200 m$^2$/gram, whereby static charges, accumulating on the top surface of the synthetic sheet material, are dissipated through the electrically conductive layer.

* * * * *